(12) United States Patent
Baba

(10) Patent No.: US 7,460,451 B2
(45) Date of Patent: Dec. 2, 2008

(54) INFORMATION-REPRODUCING APPARATUS EQUIPPED WITH PLL CIRCUIT

(75) Inventor: Hisatoshi Baba, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 514 days.

(21) Appl. No.: 10/372,309

(22) Filed: Feb. 25, 2003

(65) Prior Publication Data

US 2003/0161235 A1 Aug. 28, 2003

(30) Foreign Application Priority Data

Feb. 28, 2002 (JP) .............................. 2002-053947

(51) Int. Cl.
*G11B 7/005* (2006.01)
(52) U.S. Cl. .............. 369/47.28; 369/53.34; 369/59.22; 369/44.25; 369/44.32; 369/47.18; 369/59.12
(58) Field of Classification Search ............. 369/53.34, 369/47.28, 59.22, 44.25, 44.32, 47.18, 59.12
See application file for complete search history.

(56) References Cited

U.S. PATENT DOCUMENTS

| 5,045,812 | A | * | 9/1991 | Tateishi | ........................ | 331/10 |
| 5,161,142 | A | * | 11/1992 | Okano | ........................ | 369/47.4 |
| 5,719,843 | A | * | 2/1998 | Nakajima et al. | ......... | 369/59.22 |
| 5,982,718 | A | * | 11/1999 | Takiguchi | ................. | 369/124.1 |
| 6,542,039 | B1 | * | 4/2003 | Ogura | ........................ | 331/11 |
| 6,549,352 | B1 | * | 4/2003 | Uno et al. | ...................... | 360/46 |
| 6,693,862 | B1 | * | 2/2004 | Shigemori | ............... | 369/47.31 |
| 6,768,706 | B1 | * | 7/2004 | Tonami | .................... | 369/47.25 |
| 6,788,484 | B2 | * | 9/2004 | Honma | ........................ | 360/51 |
| 6,791,776 | B2 | * | 9/2004 | Kato et al. | ..................... | 360/39 |
| 7,145,850 | B2 | * | 12/2006 | Takumai et al. | ........... | 369/47.31 |
| 2001/0038585 | A1 | * | 11/2001 | Ishibashi et al. | ......... | 369/47.28 |
| 2002/0067677 | A1 | * | 6/2002 | Miyashita et al. | ......... | 369/59.16 |
| 2002/0176344 | A1 | * | 11/2002 | Furuta et al. | ............. | 369/59.22 |
| 2003/0103426 | A1 | * | 6/2003 | Fujimori | ................... | 369/44.36 |

FOREIGN PATENT DOCUMENTS

JP 06-076486 3/1994

* cited by examiner

*Primary Examiner*—Tan X Dinh
*Assistant Examiner*—Linh T Nguyen
(74) *Attorney, Agent, or Firm*—Fitzpatrick, Cella, Harper & Scinto

(57) ABSTRACT

The present invention provides highly reliable PLL without influence of variations in amplitude of a reproduced signal or variations in inclination of an edge. An information-reproducing apparatus according to the present invention includes a unit for detecting a phase difference between a reproduced signal and a reproducing clock signal, a PLL circuit for regulating a frequency of the reproducing clock signal to compensate for the detected phase difference, a unit for detecting a state of the PLL circuit, and a unit for regulating a loop gain of the PLL circuit corresponding to the detected state.

3 Claims, 18 Drawing Sheets

INFORMATION-REPRODUCING APPARATUS EQUIPPED WITH PLL CIRCUIT

BACKGROUND OF THE INVENTION

1. Field of the Invention

The present invention relates to an information-reproducing apparatus for reproducing digital data recorded on an information-recording medium on the basis of a reproducing clock generated by a PLL (Phase Locked Loop) circuit.

2. Related Background Art

FIG. 18 is a block diagram showing an example of a data recording/reproducing apparatus such as an optical apparatus. Reference numeral 1 in FIG. 1 denotes an optical disc, which is an information recording medium, 2 denotes a spindle motor for rotating the optical disc 1 at a constant speed, 3 denotes a pickup for irradiating the optical disc 1 with a light beam, receiving a reflected light from the optical disc 1 to perform photoelectric conversion, and detecting information of information track on the optical disc 1 as a reproduced signal.

Reference numeral 4 denotes an amplifier for amplifying an output from the pickup 3, 5 denotes an analog-to-digital (A/D) converter for converting an output from the amplifier 4 into a digital value, and 6 denotes a phase difference detector where a digital reproduced signal converted at the analog-to-digital converter 5 is input and a reproducing clock, which is an output from VCO (voltage controlled oscillator) 9 is supplied for detecting a phase difference between the digital reproduced signal and the reproducing clock. Reference numeral 7 denotes a loop filter, to which a phase difference that is an output from the phase difference detector 6 is input. Loop filter 7 stabilizes loop characteristics of PLL loop consisting of the analog-to-digital converter 5, phase difference detector 6, loop filter 7, digital-to-analog converter 8, and VCO 9 and cuts unnecessary high-pass component.

Reference numeral 8 denotes a digital-to-analog converter which converts an output from a loop filter into analog voltage, and 9 denotes a voltage controlling oscillator (so-called VCO) in which an oscillating frequency fluctuates according to an output from the digital-to-analog converter 8. Reference numeral 10 denotes a data separator for processing a digital reproduced signal, which was digitalized at the analog-to-digital converter 5, and outputting the signal as a binary signal. A data recorded on the optical disc 1 is usually modulated appropriately to disc characteristics. For example, the optical disc 1 records modulated data such as 1-7 modulation. Reference numeral 11 denotes a demodulator for demodulating the 1-7 modulation, and 12 denotes ECC (Error Correction Code) block for decoding Reed-Solomon code, which corrects an error in demodulated data.

Next, a method for detecting phase difference in PLL will be described with reference to FIG. 19. (a) of FIG. 19 denotes a reproducing clock of the VCO 9, and (b) of FIG. 19 denotes a reproduced signal reproduced at the optical disc 1 and amplified at the amplifier 4. A sample value taken by the analog-to-digital converter 5 at an edge point of a reproduced signal shown in (b) of FIG. 19 will be a phase difference signal (a sample point designated by an arrow in FIG. 19).

As shown as (b) of FIG. 19, an edge of a reproduced signal inclines. When a sample timing of the analog-to-digital converter 5 occurs at the center of this inclination, a phase difference between the clock and the reproduced signal is zero. For example, if a reproduced signal delays, a sample value taken by the analog-to-digital converter 5 is less than that taken at the point of phase difference zero; if a reproduced signal leads, a sample value taken by the analog-to-digital converter 5 is greater than that taken at the point of phase difference zero.

According to this principal, a phase difference between the clock and the reproduced signal is detected, and the detected phase difference signal is supplied through the loop filter 7 and the digital-to-analog converter 8, which have appropriate frequency characteristics and gains, to the control voltage of VCO 9. When the phase difference detector 6 detects any delay of a reproduced signal at this moment, oscillating frequency of VCO 9 is decreased. When a phase of a reproduced signal leads, oscillating frequency of VCO 9 is increased. PLL loop operates in this manner.

Recent advance in technology of manufacturing highly denser optical discs necessitates a high accuracy of a PLL circuit for reproducing a reproducing clock from a reproduced signal. As information on an optical disc increases in density, a signal recorded on the optical disc, i.e., recording mark, becomes finer, which highly reduces the quality of a reproduced signal. Variations in quality of reproduced signals for each optical disc or within a single optical disc adversely affect PLL performance.

As amplitude of a signal changes, amplitude of a reproduced signal waveform shown as (b) of FIG. 19 changes, and sensitivity of a phase difference signal to be detected also changes. As a result, a loop gain of PLL changes. At worst, a loop becomes too unstable to keep following PLL, or tractability of a loop degrades and lowers synchronism between the clock and the reproduced signal, which causes high frequency of errors in the data separator 10.

There is variation in not only amplitude of reproduced signal but also inclination of an edge of a reproduced signal depending on variations in quality of optical discs, variations in laser powers, or an error in controlling an optical spot against an information track such as in focus tracking. A change in inclination of an edge is represented as changes in sensitivity of phase difference detection, similarly as changes in amplitude of a reproduced signal, which result in an unstable PLL as described above. Control voltage-to-frequency change characteristics of VCO 9, i.e., a gain of VCO also have wide variations from oscillator to oscillator, which causes unstable PLL.

FIG. 20 is a board diagram showing loop transfer characteristics of PLL. In FIG. 20, a curve designated by reference character "b" shows the case of an appropriate loop characteristic, a curve "a" shows the case of a low loop gain with low PLL tractability, and a curve "c" shows the case of a high loop gain with unstable PLL. In general, the higher-density an optical disc is recorded, the worse S/N and jitter for a reproduced signal in comparison with the lower-density recording, thus, the worse a tractability of PLL.

FIG. 21 is a block diagram showing an information-reproducing apparatus proposed in Japanese Patent Application Laid-Open No. 6-76486. This application discloses a configuration for changing a time constant of PLL for at starting point and for stationary state. The same numerals designate the same parts in FIG. 21 as those in FIG. 18. In FIG. 21, 7A and 7B denote loop filters. When the loop filter 7A is selected with a switch 13, it will make PLL with a small time constant of a loop characteristic for an entire PLL and a characteristic of high-speed response. When the loop filter 7B is selected with the switch 13, it will make PLL with a large time constant of a loop characteristic for an entire PLL and high stability.

Usual optical disc apparatus moves a pickup to a data area storing data to be reproduced (seek operation), locate the start of the data to be reproduced, start an PLL operation at the beginning of the first data. Then, when PLL locks the data is ready to be reproduced. Most optical disc apparatuses, which use "sector" as a unit of data to be recorded and reproduced, start a PLL operation at the beginning of this sector, and after PLL locked, reproduce the data. Thus, PLL, which can quickly lock after starting the operation, is required.

Dust or a scratch on a surface of a disc often affects a reproduced signal, which in turn will be a disturbance to PLL. This disturbance of PLL is caused by external factors. Therefore, it is also needed for PLL to have a characteristic for protecting its operation against such a disturbance due to the external factors. For this reason, Japanese Patent Application Laid-Open No. 6-76486 discloses forming PLL with quick response and a small time constant by selecting the loop filter 7A at starting PLL for the first time for a sector, and forming PLL with high stability and a large time constant by switching to the loop filter 7B after the PLL is locked.

However, in the structure of Japanese Patent Application Laid-Open No. 6-76486, characteristics of a PLL circuit have already fixed when the optical disc apparatus is designed, thus, it cannot deal with variations in amplitude of a reproduced signal and inclination of an edge caused by variations in quality of optical discs. This results in various loop gains of PLL, and at worst, it caused problems where a loop becomes too unstable to keep following PLL, or tractability of a loop degrades and lowers synchronism between a clock and a reproduced signal, which causes high frequency of errors in a data separator.

SUMMARY OF THE INVENTION

The present invention provides an information-reproducing apparatus for enabling information reproduction with high reliability by appropriately regulating a loop gain of PLL without being affected by the variation of amplitude of a reproduced signal or inclination of an edge.

According to the present invention, an information-reproducing apparatus for generating a reproducing clock signal on a basis of a reproduced signal from an information recording medium, comprises: means for detecting a phase difference between the above-mentioned reproduced signal and the above-mentioned reproducing clock signal; a PLL circuit for regulating a frequency of the above-mentioned reproducing clock signal to compensate for the detected phase difference; means for detecting a state of the above-mentioned PLL circuit; and means for regulating a loop gain of the PLL circuit corresponding to the detected state.

DETAILED DESCRIPTION OF THE PREFERRED EMBODIMENTS

Embodiments of the present invention will be described in detail with reference to the drawings.

First Embodiment

Figure 1:
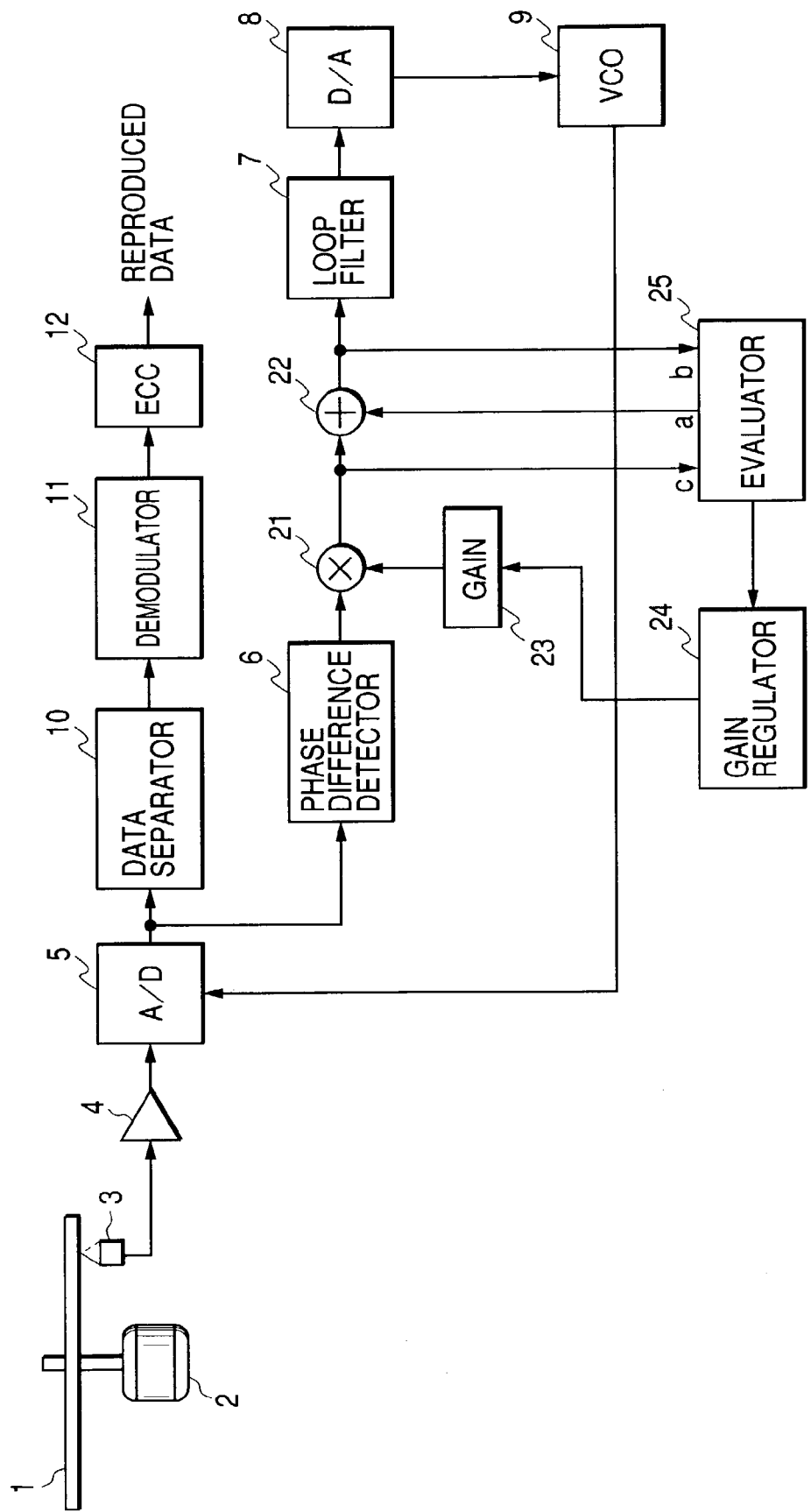
FIG. 1 is a block diagram showing a configuration of a first embodiment of the present invention.
Figure 18:
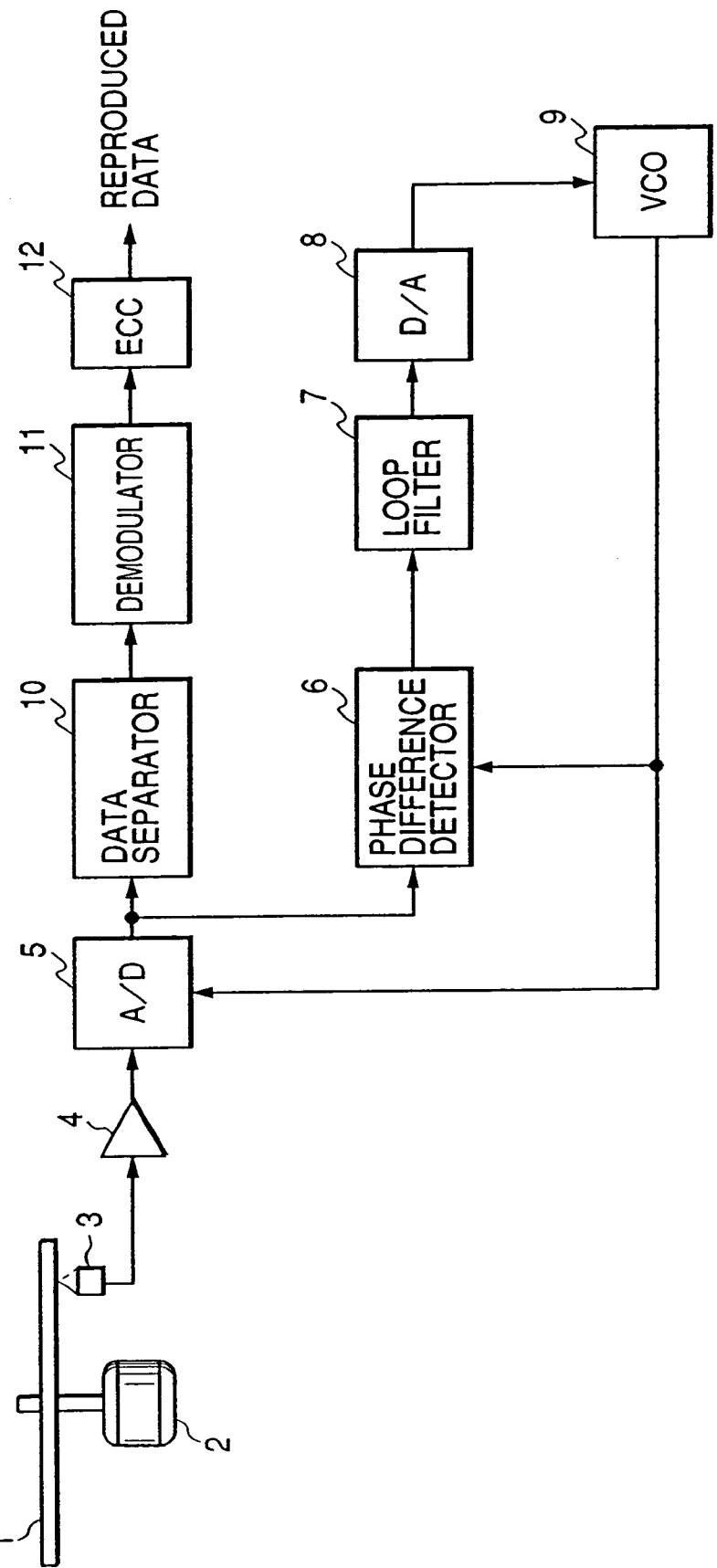
FIG. 18 is a block diagram showing a data recording/reproducing apparatus according to a conventional example.
Figure 19:
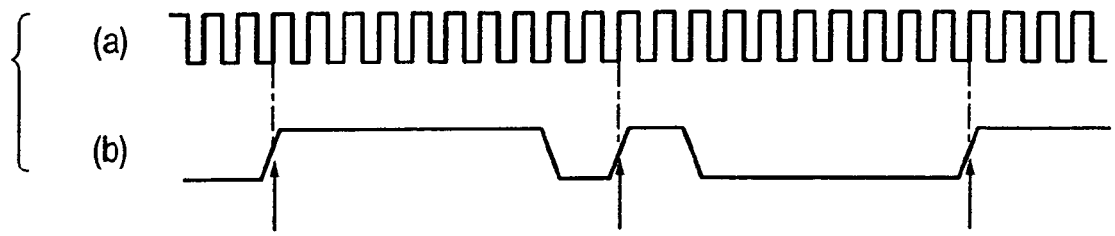
FIG. 19 is a diagram illustrating phase difference detecting of PLL in a conventional apparatus.

FIG. 1 is a block diagram showing a configuration of the first embodiment of the present invention. In FIG. 1, the same numerals designate the same parts as those of a conventional apparatus shown in FIG. 18 and description of them is omitted. In FIG. 1, reference numeral 21 denotes a multiplier, which multiplies an output from phase difference detector 6 by a gain set value stored in a gain 23 and outputs the result. Reference numeral 22 denotes an adder, which adds an output from an evaluator 25 to an output from the multiplier 21 and outputs the result.

The evaluator 25 is for measuring PLL loop characteristics with a port "a" for outputting a sine wave for measurement, ports "b" and "c" for inputting signals before and after addition at the adder 22. Reference numeral 24 is a gain regulator, which sets a gain set value in the gain 23 on the basis of the result from the evaluator 25 and changes a gain of PLL.

Now, operations of the present embodiment will be described. In the embodiment, processes described below are performed in an area recording information data of optical disc 1 prior to reproducing information data. First, the gain regulator 24 sets 0 dB in the gain 23. In this case, a gain of multiplier 21 becomes 0 dB, and the gain of multiplier 21 is 1. Next, PLL starts at the sector recording information data as in the conventional manner.

PLL locks after a certain time period, and then the evaluator 25 outputs a 50 KHz sine wave from the port "a" under this condition. The sine wave is added to a loop at the adder 22. The 50 KHz signal component is also superimposed on signals before and after the adder 22. The evaluator 25 measures amplitude of 50 KHz component of each signal input to the ports "b" and "c". Ratio of measured amplitude of the port "c" to the port "b" (c/b) is a transfer gain of 50 KHz in loop-transfer characteristics of PLL.

Figure 20:
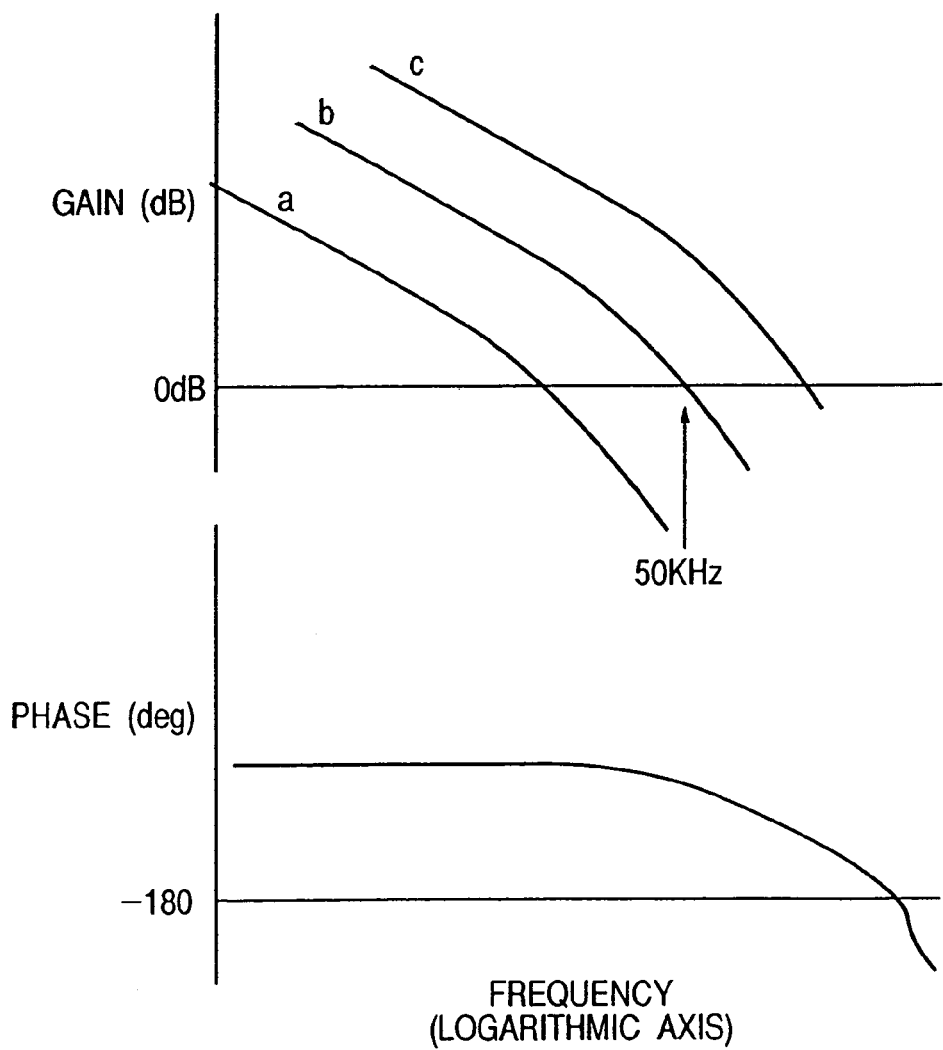
FIG. 20 is a board diagram showing loop-transfer characteristics of PLL.
Figure 21:
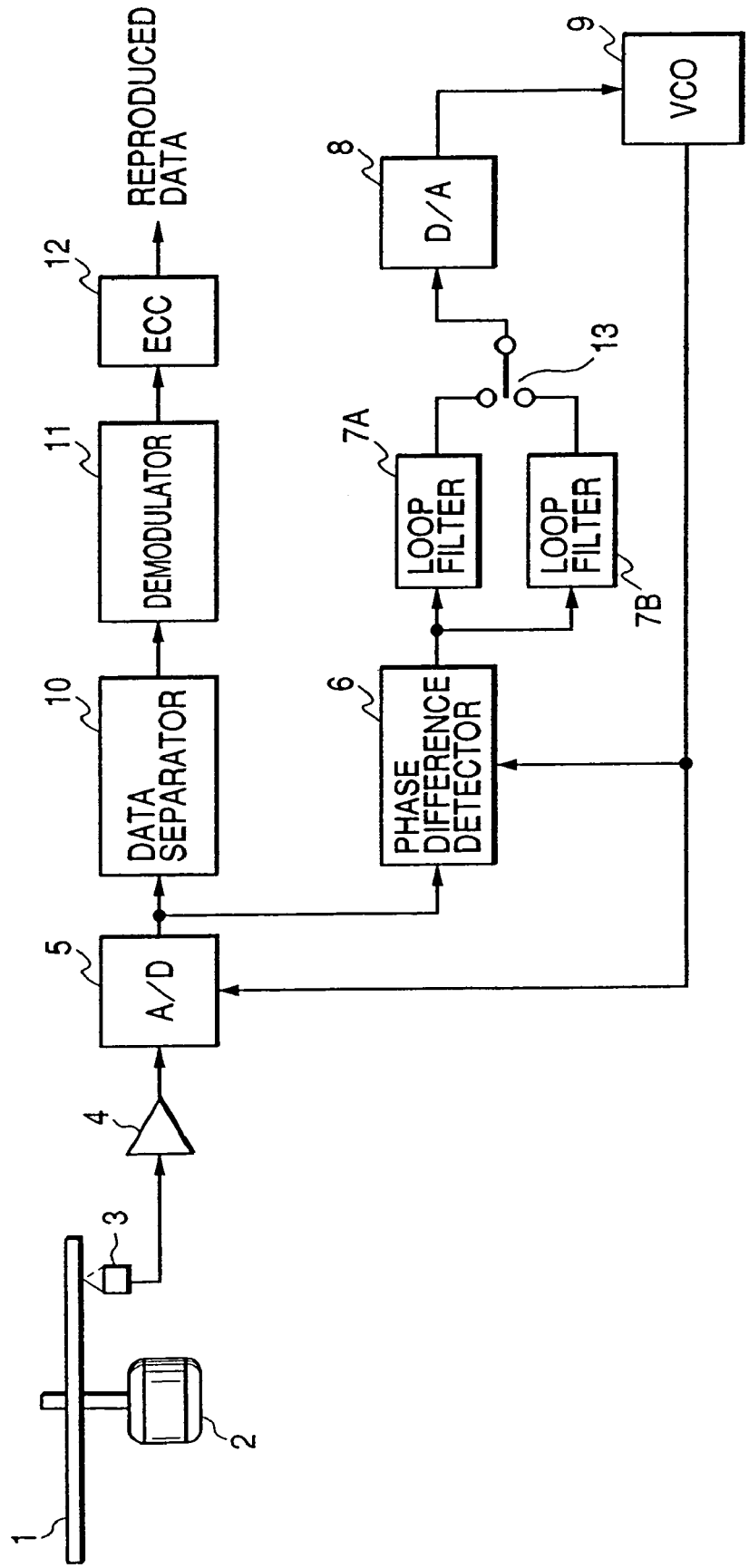
FIG. 21 is a block diagram showing another conventional apparatus.

The evaluator 25 outputs an inverse number of this transfer gain (inverse code with representation of dB) to the gain regulator 24. In this case, for example, if this transfer gain is −3 dB, this corresponds to the state of the curve "a" in FIG. 20 where a loop gain is low. The gain regulator 24 sets +3 dB in the gain 23 so as to make a transfer gain 0 dB. A gain set in the gain 23 is used for an operation of the multiplier 21. The multiplier 21 has a gain of +3 dB and multiplies it by an output from the phase difference detector 6. This can make a loop gain of PLL +3 dB, and a 50 KHz transfer gain of loop transfer characteristics can be made 0 dB.

On the other hand, in the case that a 50 KHz transfer gain of loop-transfer characteristics is +3 dB (this corresponds to the state of the curve "c" in FIG. 20), the gain regulator 24 sets −3 dB in the gain 23, which makes a gain −3 dB in the multiplier 21, which multiplies it by an output from the phase difference detector 6. This can make a 50 KHz transfer gain of a loop transfer characteristic 0 dB in the same manner.

As described above, the present embodiment can eliminate adverse effects of variations in amplitude of a reproduced signal, inclination of an edge, and VCO by measuring a loop transfer characteristic of PLL and regulating the characteristic to match a regulated loop transfer gain, there by making it possible to have appropriate tractability and constitute a stable PLL.

Second Embodiment

Figure 2:
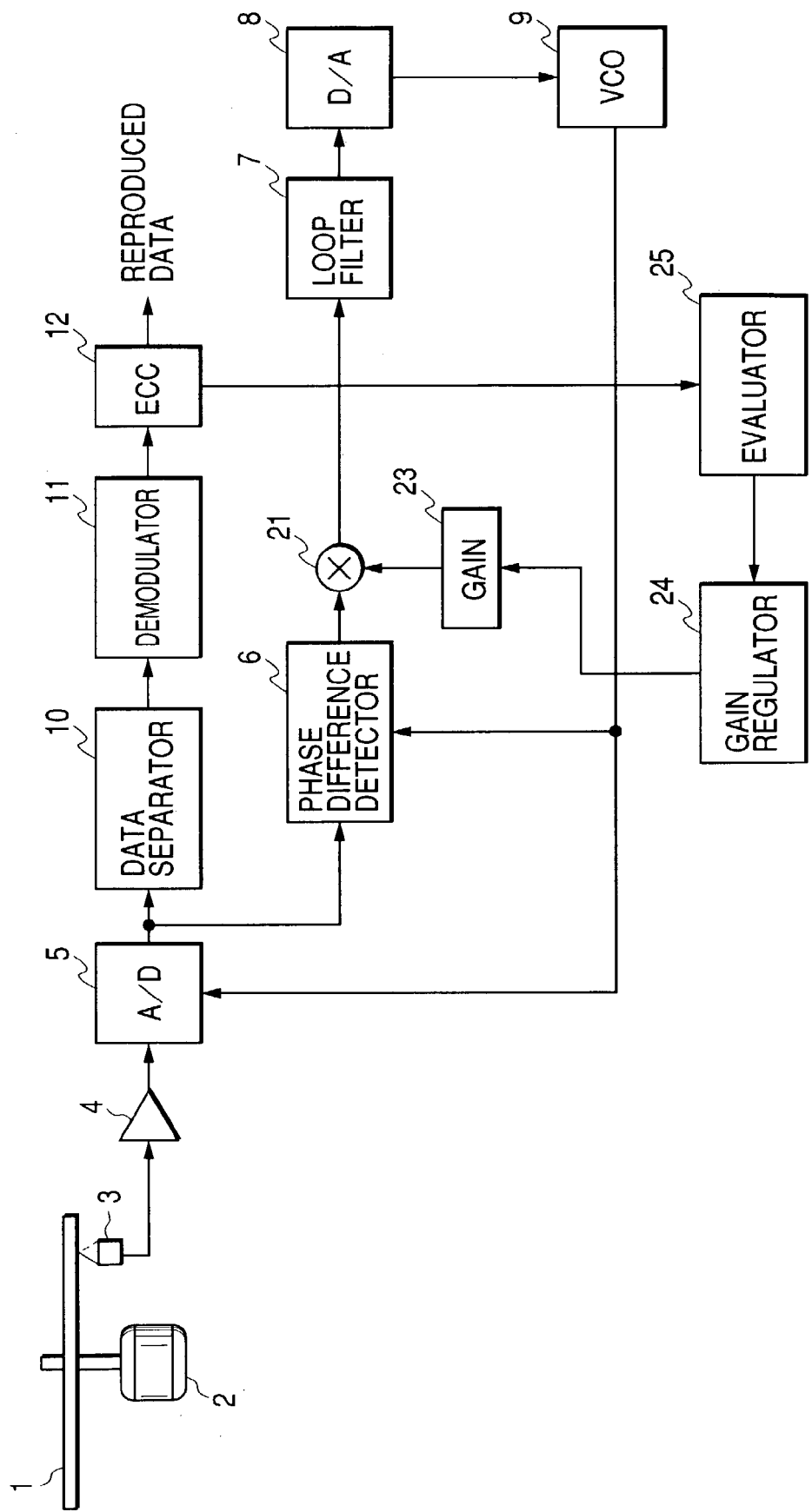
FIG. 2 is a block diagram showing a configuration of a second embodiment of the present invention.

FIG. 2 is a block diagram showing a configuration of the second embodiment of the present invention. In FIG. 2, the same numerals designate the same parts as those in FIG. 1 and description of them is omitted. In the second embodiment, a reproduced signal is processed by a data separator 10 and a demodulator 11, an error rate is detected in ECC 12, and a gain 23 is regulated according to this error rate. For example, a gain regulator 24 sets −6 dB in the gain 23 and an evaluator 25 stores the error rate measured at ECC 12. Next, the gain regulator 24 sets −4 dB in the gain 23, and the evaluator 25 stores the error rate at this moment. The gain regulator 24 changes a gain to set in the gain 23 like −6, −4, . . . , +2, +4 dB in this manner, and the evaluator 25 stores an error rate for each case in association with each set gain.

Figure 3:
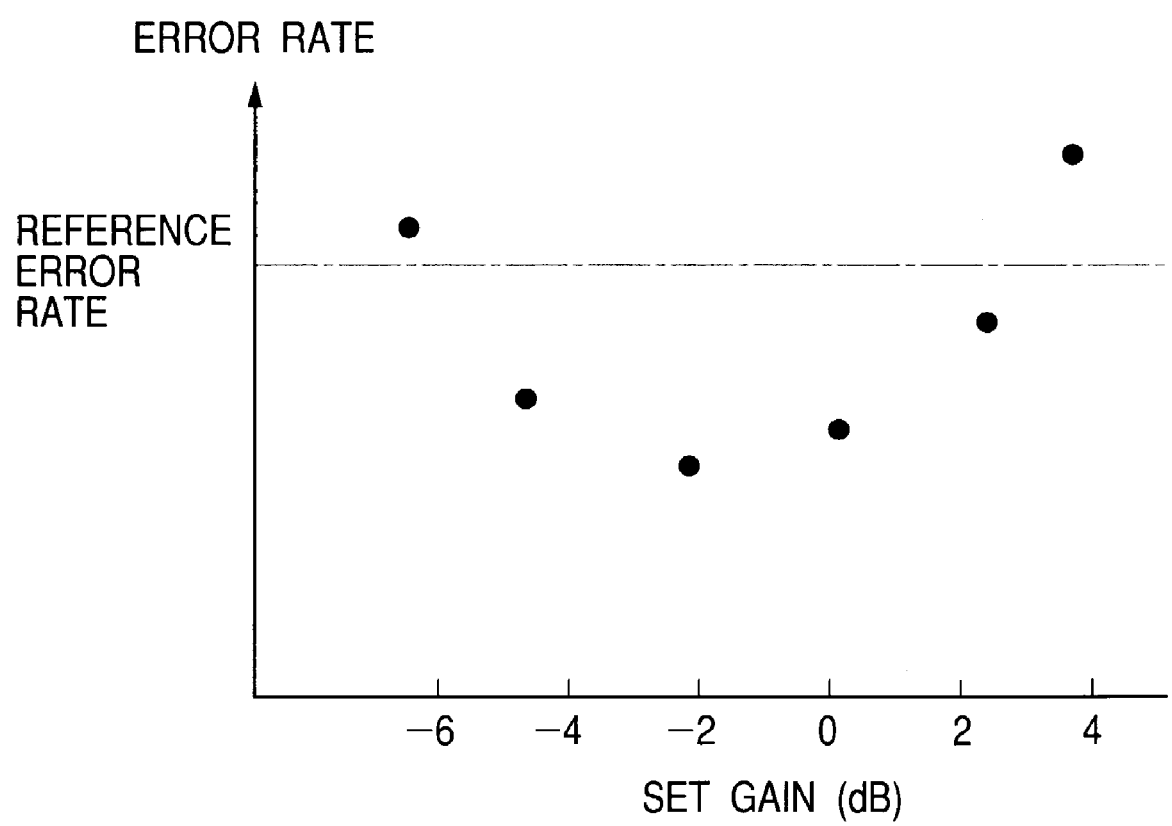
FIG. 3 is a graph showing an exemplary measurement for a set gain and an error rate in PLL of the embodiment shown in FIG. 2.

FIG. 3 shows an exemplary measurement. When a gain set in the gain 23 changes, an error rate measured at ECC 12 also changes as shown in FIG. 3, which results in the characteristic where an error rate increases at both the biggest end and the smallest end of the set gain. The evaluator 25 finds a gain crossing a line of a reference error rate (e.g., 1e-3) shown in FIG. 3 in the measured data and determines a set gain.

Gains crossing the reference error rate line found by using a primary interpolation in the case of FIG. 3 are −5.8 dB and +3 dB. A set gain is determined to be −1.4 dB, the medium value of these values, and the gain regulator 24 sets −1.4 dB in the gain 23. In this manner, PLL characteristics with the minimum error rate of a reproduced data can be set. Although in the present embodiment, a logarithmic value of a gain is used for the axis of abscissas in FIG. 3, a set gain can be determined by handling gain values lineally.

In the present embodiment, in which characteristics of PLL is determined on the basis of an error rate of a reproduced data, a PLL gain can be set in consideration of total performance such as noise characteristics of an actual disc, and an apparatus with a bigger margin can be provided in comparison with the case where characteristics of PLL is similarly determined on the basis of a loop gain of PLL and a bandwidth of PLL.

Third Embodiment

Figure 4:
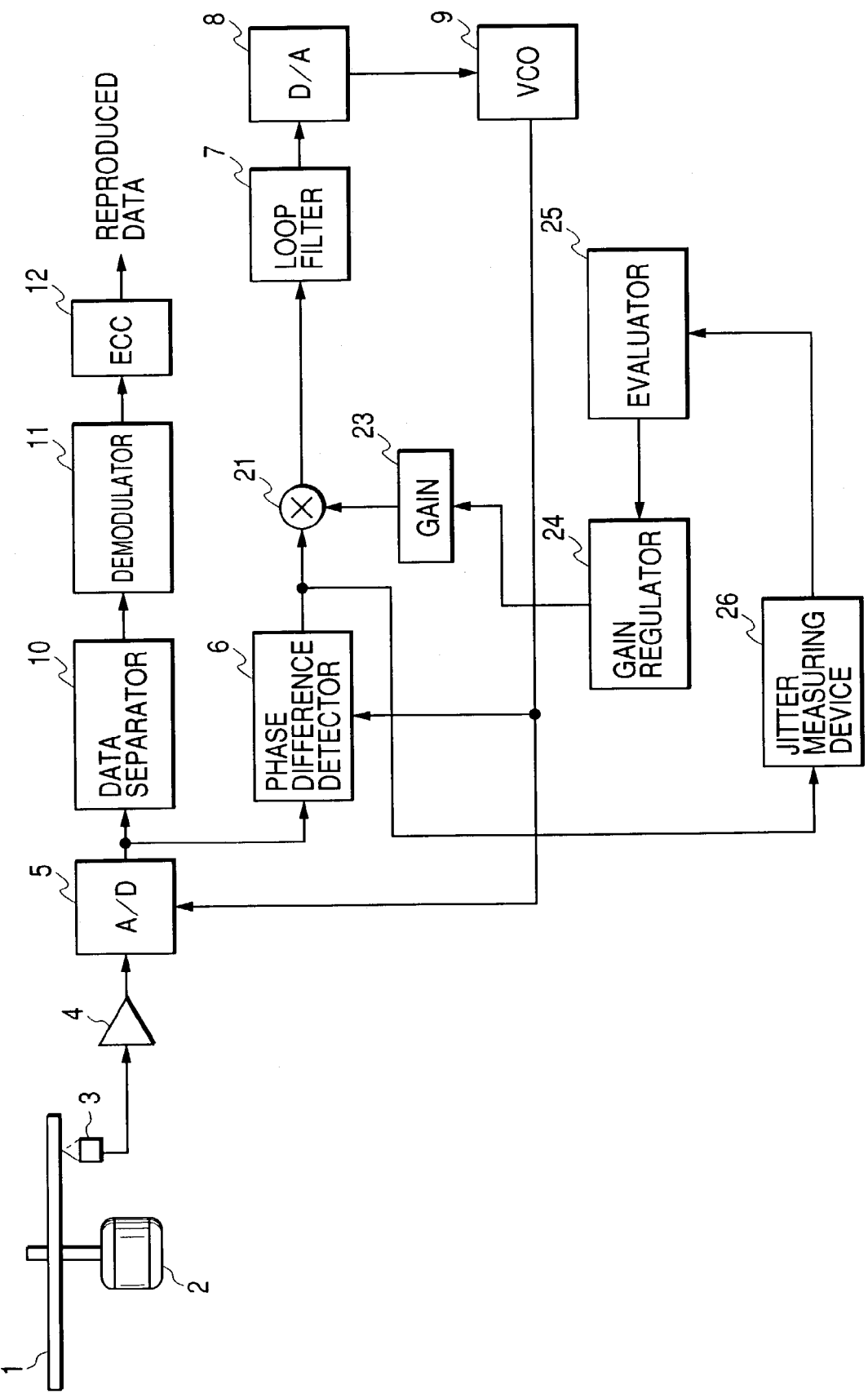
FIG. 4 is a block diagram showing a configuration of a third embodiment of the present invention.

FIG. 4 is a block diagram showing the third embodiment of the present invention. In FIG. 4, the same numerals designate the same parts as those in FIG. 2 and description of them is omitted. In the third embodiment, a phase difference, which is an output from a phase difference detector 6, is used as a loop evaluation for PLL. Phase difference from the phase difference detector 6 is supplied to a jitter measuring device 26, which measures the jitter of a phase difference signal.

More specifically, at first, for example, a gain regulator 24 sets −6 dB in the gain 23. The jitter measuring device 26 measures the jitter of a phase difference at this moment, and an evaluator 25 stores the measured jitter. Next, for example, the gain regulator 24 sets −4 dB in the gain 23, and the evaluator 25 stores the jitter measured at the jitter measuring device 26 at this moment. The gain regulator 24 changes a gain to be set in the gain 23 like −6, −4, . . . , +2, +4 dB in this manner, and the evaluator 25 stores a jitter for each case in association with each set gain.

Figure 5:
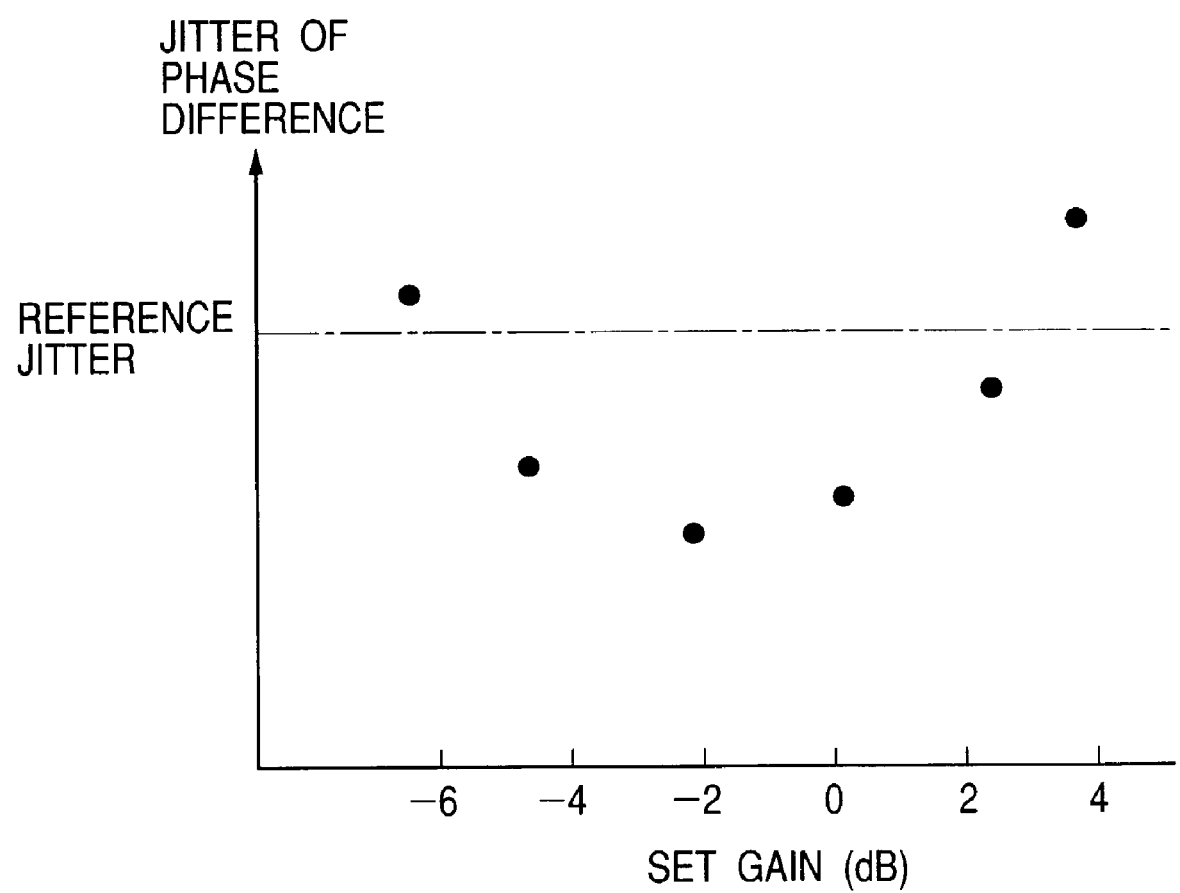
FIG. 5 is a graph showing an exemplary measurement for a set gain and phase difference jitter in PLL of the embodiment shown in FIG. 4.

FIG. 5 shows an example of measurement results. As a gain set in the gain 23 changes like this, a jitter measured at the jitter measuring device 26 also changes as shown in FIG. 5, which results in the characteristic where the jitter increases at both the biggest end and the smallest end of the set gain. The evaluator 25 finds a gain crossing a reference jitter line (e.g., 5 ns) shown in FIG. 5 in the measured data and determines a set gain. Gains crossing the reference jitter line found by using a primary interpolation in the case of FIG. 5 are −5.8 dB and +3 dB. A set gain is determined to be −1.4 dB as the medium value of these values and the gain regulator 24 sets −1.4 dB in the gain 23. In this manner, PLL characteristics with the minimum jitter of a phase difference can be set. Though in the present embodiment, a logarithmic value of a gain is used for axis of abscissas in FIG. 5, a set gain can be determined by handling gain values lineally.

In the present embodiment, in which loop characteristics of PLL is evaluated by using a phase difference in this manner, loop characteristics can be evaluated in a shorter time than in the second embodiment. In other words, as the second embodiment uses an error rate in evaluation, the evaluation is performed only for the part with erroneous data. Thus, the second embodiment needs pieces of data of at least 1e3 as it is designated by an error rate around 1e-3, and pieces of data around 1e4 are required for statistically maintaining accuracy. However, for a jitter value of a phase difference signal, magnitude of a phase difference can be treated in an analog fashion. By using this in evaluation, a condition with error-prone data (data with high possibility of error) is also evaluated, thus, a loop can be evaluated in a shorter time than in the second embodiment.

Fourth Embodiment

Figure 6:
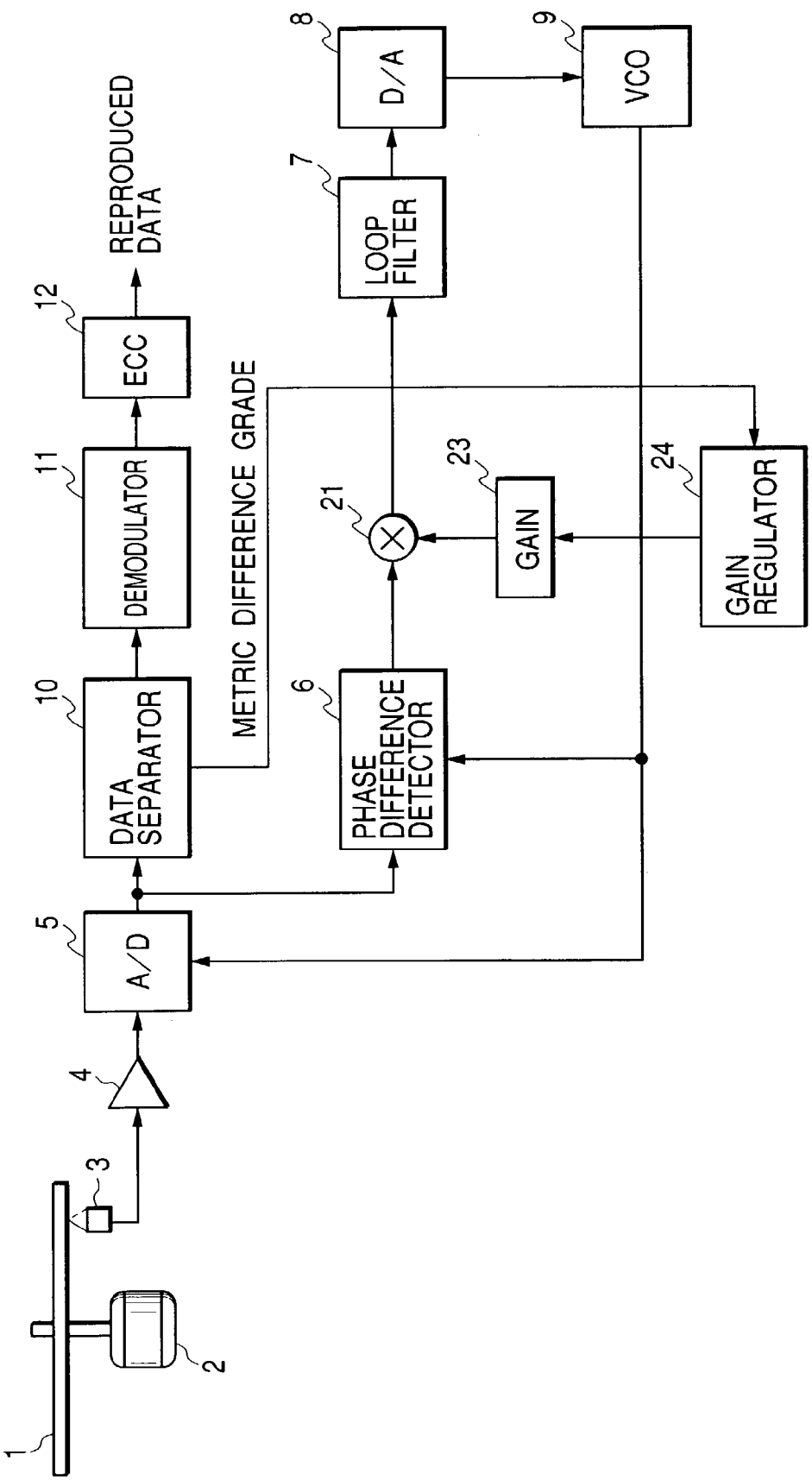
FIG. 6 is a block diagram showing a configuration of a fourth embodiment of the present invention.

FIG. 6 is a block diagram showing the fourth embodiment of the present invention. In FIG. 6, the same numerals designate the same parts as those in FIG. 2 and description of them is omitted. In this embodiment, a data separator 10 internally has a function for evaluating a reproduced signal grade and outputs the grade as a metric difference grade to a gain regulator 24.

Figure 7:
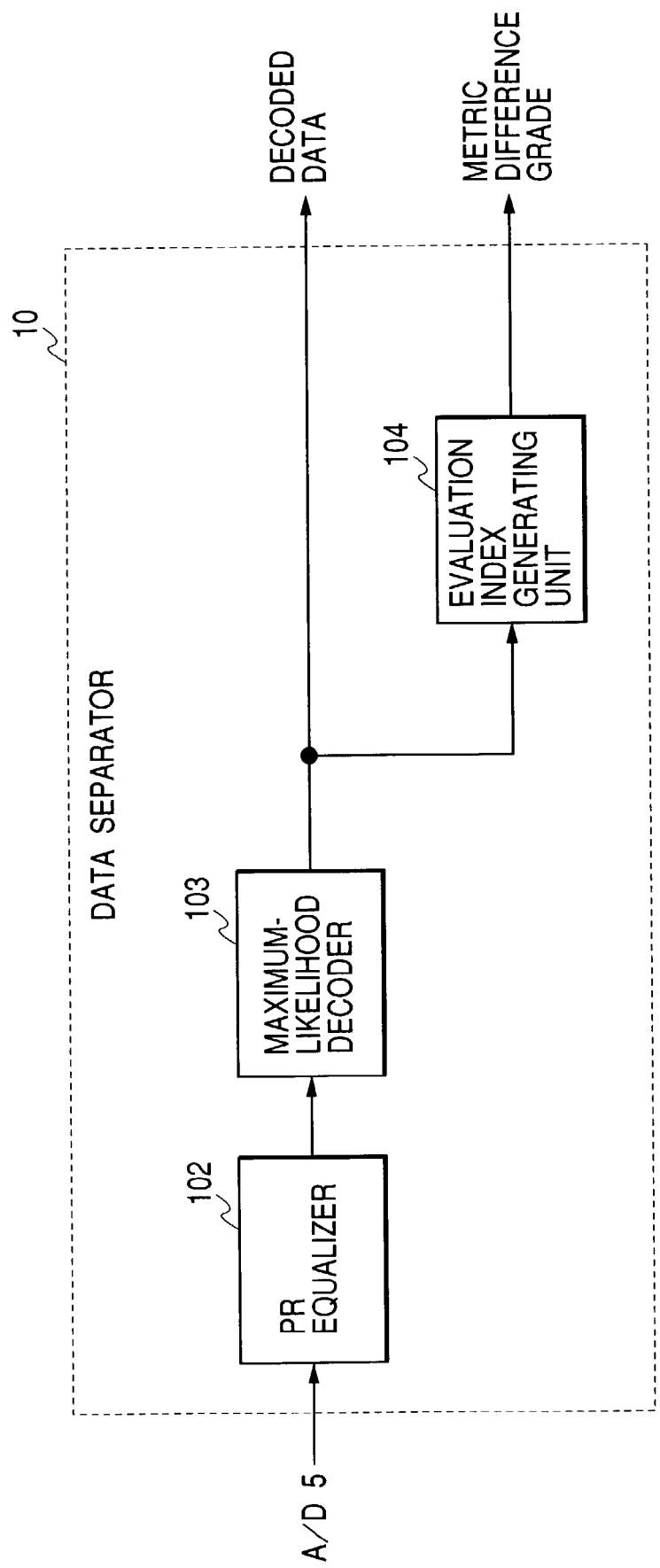
FIG. 7 is a block diagram showing a specific example of a data separator of the embodiment shown in FIG. 6.

FIG. 7 is a block diagram showing a specific example of the data separator 10. In FIG. 7, reference numeral 102 denotes a PR equalizer, which equalizes an analog-to-digital converted reproduced signal. PR, standing for partial response, uses PR (1, −1) characteristics in this example. Reference numeral 103 denotes a maximum-likelihood decoder, which maximum-likelihood-decodes a PR equalized signal and outputs the decoded data. Reference numeral 104 denotes an evaluation index generating unit, which generates a value to be an index in regulating various parameters. Evaluation index generated at the evaluation index generating unit 104 is output to the gain regulator 24 shown in FIG. 6.

The features of the present embodiment reside in that an evaluation index is generated on the basis of likelihood, which indicates reliability of a decoded data series of PRML, and regulates a gain of PLL by using the evaluation index. The present embodiment will be described with an example of an evaluation index where RLL (1, 7) code is used, a recorded code series with the minimum run-length being 1 is recorded by NRZI, and it is reproduced in PRML (Partial-Response Maximum-Likelihood) method. Partial response characteristics are considered to be PR (1, −1).

First, a state transition diagram can illustrate decoding process of the maximum likelihood decode. A state S at a certain time k can be any of the following four states according to decoded bits of a $a_{K-1}$, $a_K$ at time k−1 and time k.

S00 ($a_{k-1}$=0, $a_k$=0)
S01 ($a_{k-1}$=0, $a_k$=1)
S10 ($a_{k-1}$=1, $a_k$=0)
S11 ($a_{k-1}$=1, $a_k$=1)

Figure 8:
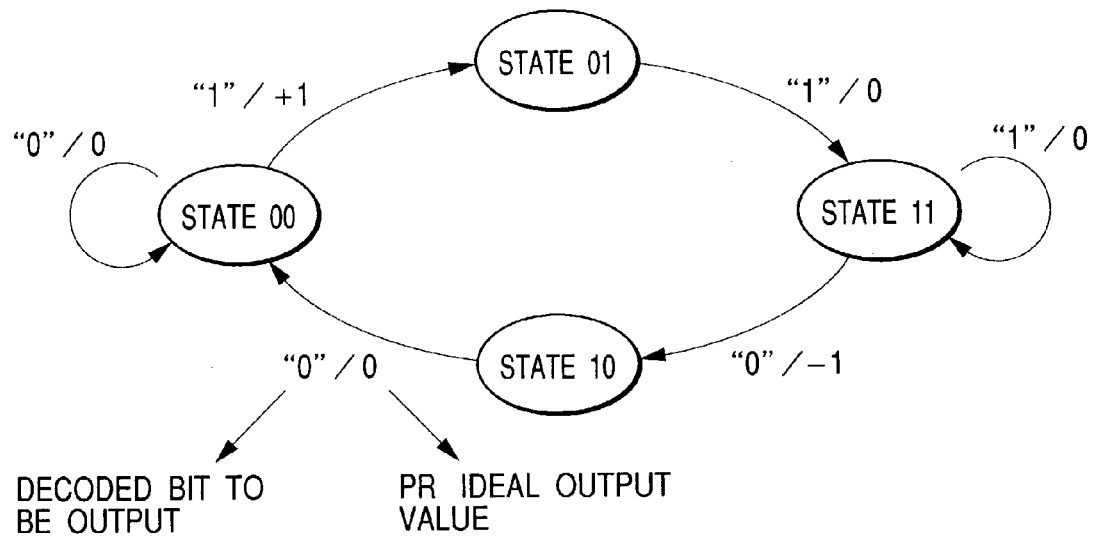
FIG. 8 is a state transition diagram of a decoding process of maximum-likelihood decode of the embodiment shown in FIG. 6.
Figure 9:
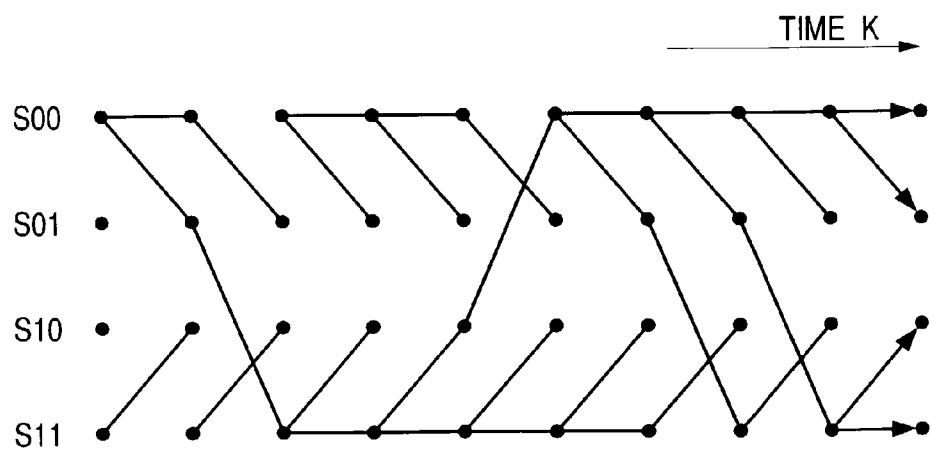
FIG. 9 is a trellis diagram illustrating the state transition diagram shown in FIG. 8 in the direction of time axis.

FIG. 8 shows the state transition diagram at this moment. Each state changes to the next state according to a decoded bit to be output as shown in FIG. 8. For example, when PR ideal output value is +1 at the state 00 (S00), the state transits to the state 01 (S01) by outputting a decoded bit "1". When PR ideal output value is 0 at the state 00 (S00), the state remains to be the state 00 (S00) by outputting a decoded bit "0". FIG. 9 is a trellis diagram illustrating the state transition diagram shown in FIG. 8 in the direction of time axis. The state transition at each time shown in FIG. 9 is called "branch", and the reliability of each branch is called "branch metric", which is represented in the following expression.

$$\text{Branch metric}=(z_k-y_k)^2 \quad (1)$$

In the above expression, $Z_k$ is a reproduced signal series after actually output PR (1, −1), and $y_k$ is an output value of PR (1, −1) for an ideal reproduced series. The minimum run-length is limited to 1 in this case, thus, a state transition corresponding to each of decoded bits, 0-1-0, 1-0-1 is previously eliminated.

Figure 10:
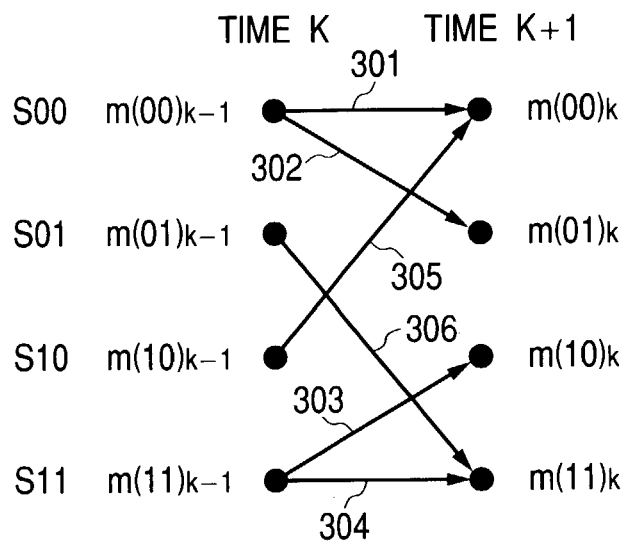
FIG. 10 is a diagram showing a branch pattern at each time in the case of decoding a recorded code series, in which minimum run-length of RLL (1, 7) code uses a condition of 1, by PRML.

In the case that a recorded code series using a condition of the minimum run length of RLL (1, 7) code being 1 (referred to as "d restriction", hereinafter) is decoded by PRML, a branch at each time appears to be any of the patterns shown in FIG. 10. As shown in FIG. 10, branches 301 and 305 join in the state S00 and branches 304 and 306 join in the state S11 at each time. One of branches joining for each time is selected in Viterbi decoding. The states S01 and S10 transit along branches 302 and 303, respectively.

Branch Metric corresponding for each branch is shown as follows.

Branch 301 b(301)=$(z_k-0)^2$
Branch 302 b(302)=$(z_k-1)^2$
Branch 303 b(303)=$(z_k+1)^2$
Branch 304 b(304)=$(z_k-0)^2$
Branch 305 b(305)=$(z_k-0)^2$
Branch 306 b(306)=$(z_k-0)^2$ Branches determined at respective times are combined to make a trellis diagram shown in FIG. 9. A series of paths drawn as a thick line is a decoded signal series remaining at time k. Reliability of a decoded series at each time is called "path metric (likelihood)", which is determined in the following way. "min[A,B]" indicates the smaller one of A and B.

$$\text{State } S00_k m(00)_k=\min\{m(00)_{k-1}+z_k^2, m(10)_{k-1}+z_k^2\} \quad (2.1)$$

$$\text{State } S00_k m(01)_k=m(00)_{k-1}+(z_k-1)^2 \quad (2.2)$$

$$\text{State } S10_k m(10)_k=m(11)_{k-1}+(z_k+1)^2\} \quad (2.3)$$

$$\text{State } S11_k m(11)_k=\min\{m(11)_{k-1}+z_k^2, m(01)_{k-1}+z_k^2\} \quad (2.4)$$

PR ideal output values are set to −1, 0, and 1 in this case. The path metric described in this example is a value represented as a cumulative value of branch metric at each time, which will make a decoded bit series where the minimum path of the path metric is output.

Each decoded bit series associated with a path leading to each of the sates S00, S01, S10 and S11, is held in four-path memories with length of n (address $a_1$-$a_n$) at a certain time k. In PRML, a path memory of a path, which is the minimum value of the path metric for each state at time k is referenced, and data on address $a_1$ is output as a decoded bit. As shown above, in Viterbi decoding, selection of branches at states S00 and S11, which are junctions of branches shown in FIG. 10, causes error in decoding. More specifically, a wrong selection of branch 305 as a branch reaching state S00 shown in FIG. 10 where the correct selection is branch 301 causes an error in decoding.

To describe this process with the expression (2.1), when branch 310 is a correct branch, the following relationship is obtained.

$$m(00)_{k-1}<m(10)_{k-1} \quad (3)$$

To evaluate a state of a reproduced signal series in a reproducing system using PRML, it is effective to use a path metric difference, which is compared at a junction of branches. In the above expression (3), when a state of reproduced signal series is good, i.e., when an influence of an edge shift is small, a difference between two metric to be compared (path metric difference) becomes large, and when a state of a signal is poor, i.e., when an influence of an edge shift is great, a difference between metrics becomes small. Therefore, when it is defined that an absolute value of a difference between two metric to be compared is Δm, the following expression is obtained.

$$\Delta m_k=|m(00)_{k-1}-m(10)_{k-1}| \quad (4)$$

Figure 11:
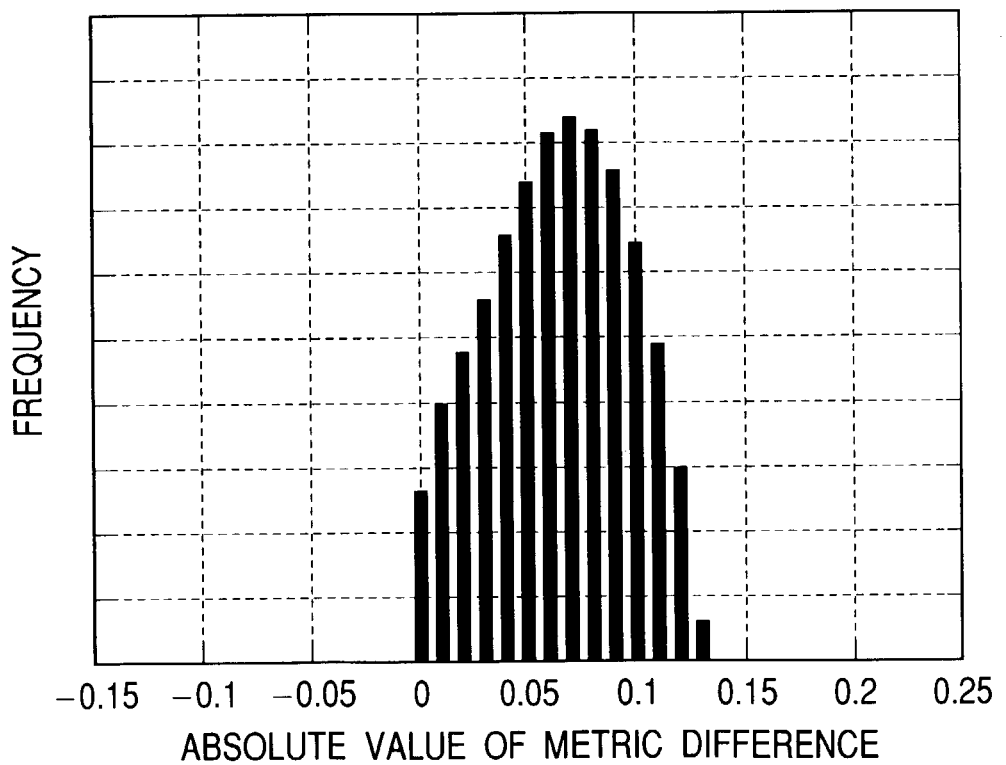
FIG. 11 is a graph showing distribution of metric differences.

FIG. 11 shows distribution of metric difference Δm. The distribution of metric differences includes a reproduced signal amplitude error and a phase error. That is to say, the distribution reflects an influence of an edge shift. As it is shown in the expression (4), a metric difference is evaluated by using an absolute value, thus, no negative value exists. A metric difference is a difference between two path metric at a junction thereof, thus, the larger the difference, the more reliable and appropriate path can be selected. On the other hand, when the difference is small, it is difficult to distinguish between a correct path and a wrong path, whereby an incidence rate of an error rises.

In the distribution of metric differences shown in FIG. 11, the frequency in the vicinity of a point of the metric difference being 0 indicates a sample with high probability of error.

Therefore, in the present embodiment, the frequency of a metric difference equal to or less than a predetermined threshold set in the vicinity of 0 is used as an evaluation index representing the state of a reproduced signal.

For regulating various parameters, a trial value of each of various parameters may be changed, a value of an evaluation index for each trial value of each parameter may be held, and a value of parameter may be set according to the trial value providing the minimum value. Or, two evaluation indices crossing a certain regulation value may be determined and the medium value of the indices may be set as will be described below.

Figure 12:
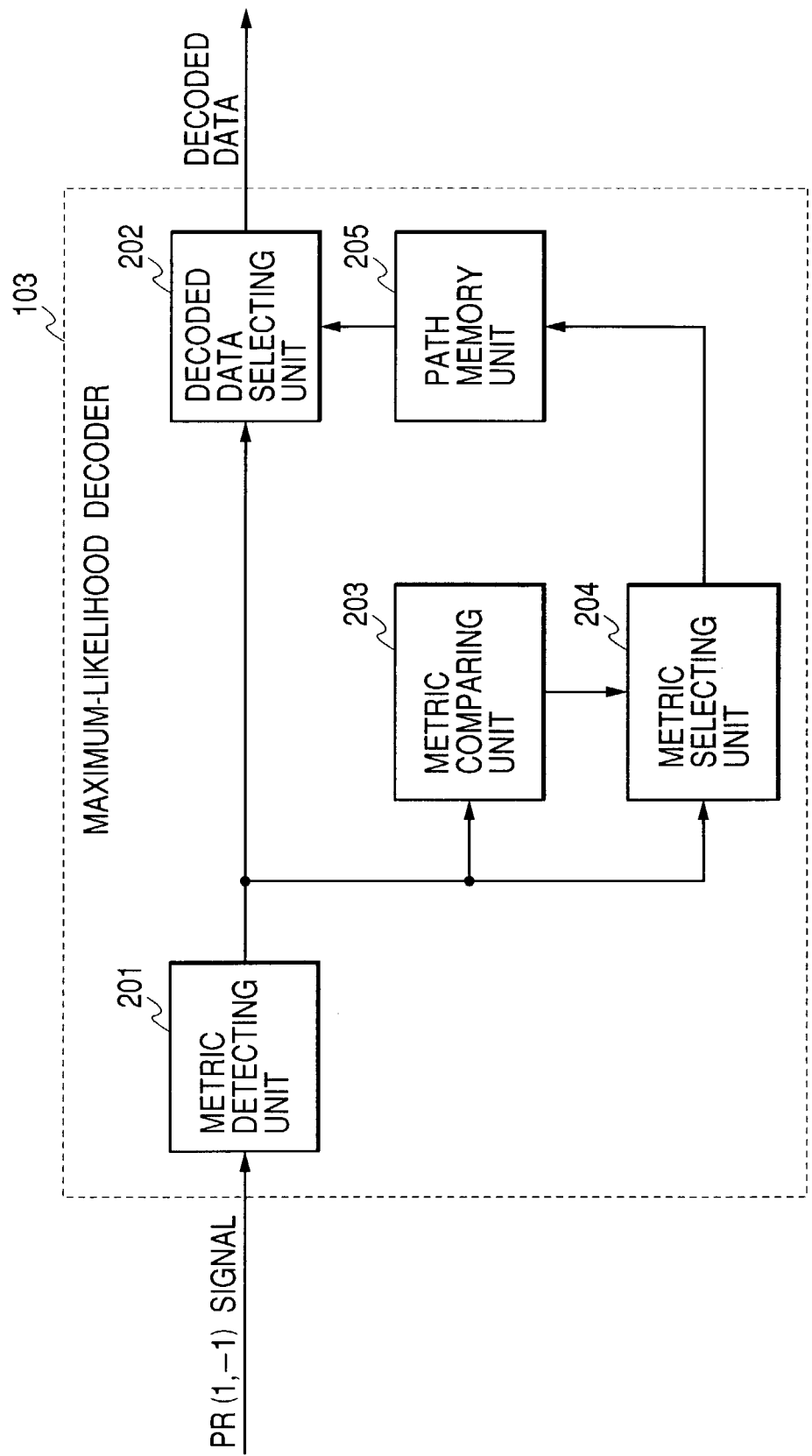
FIG. 12 is a block diagram showing a configuration of a maximum-likelihood decoder.

FIG. 12 is a schematic block diagram showing a configuration of a maximum-likelihood decoder 103. At a metric detecting unit 201, path metric is calculated on the basis of a PR equalized waveform. For calculating path metric, the expressions from (2.1) to (2.4) are used. At a path metric comparing unit 203, it is determined which of two path metric from the expressions (2.1) and (2.4) is bigger or smaller. At a metric selecting unit 204, a metric value for each state is updated on the basis of the result of this bigger/smaller determination. A control signal is also output on the basis of the result of this bigger/smaller determination.

Figure 13:
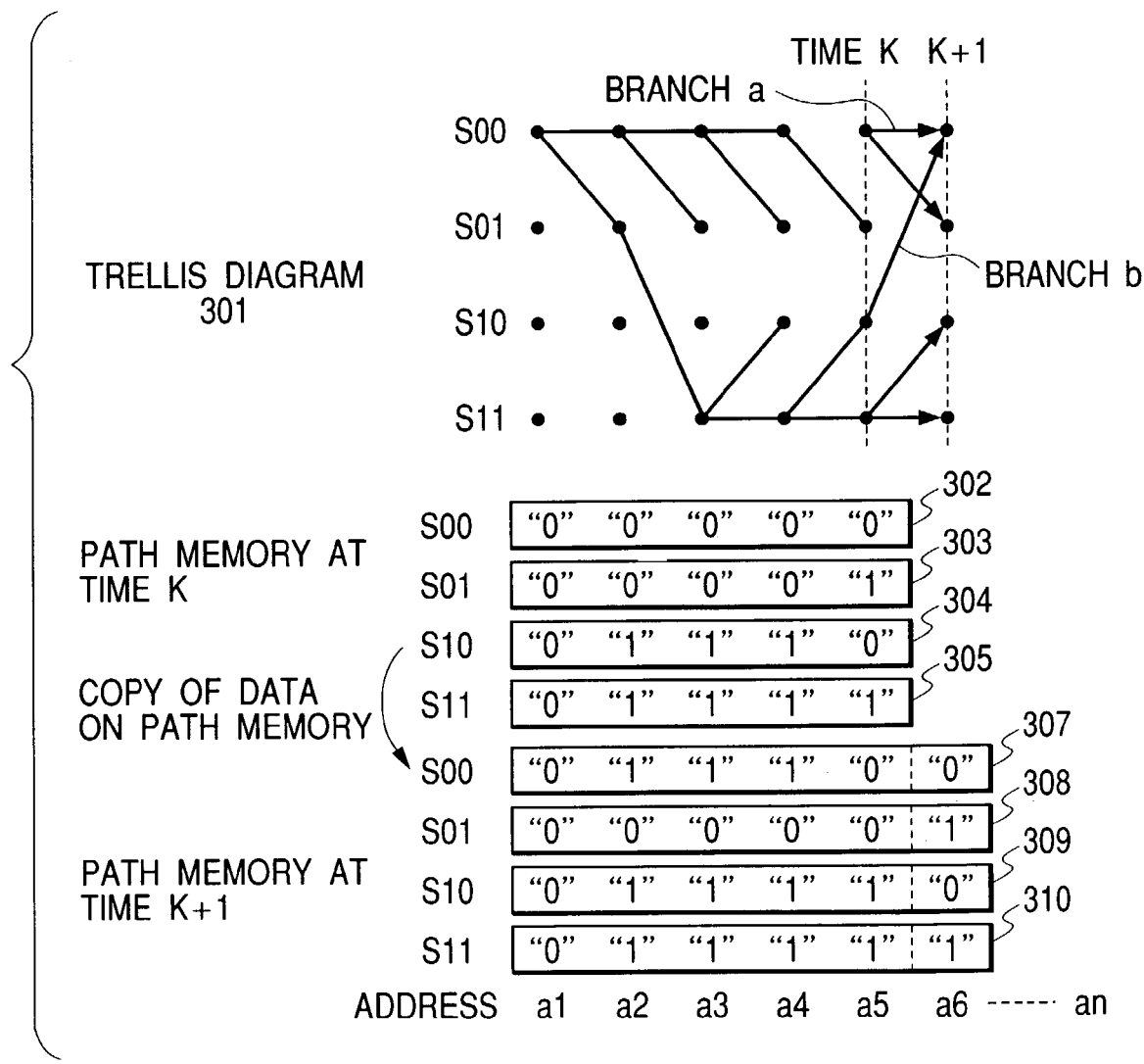
FIG. 13 is a diagram illustrating control of a path memory unit.

A path memory unit 205 is a memory to hold decoded data corresponding to a path of each state and holds a candidate for decoded data of 4×n corresponding to the states S00, S01, S10, and S11 as shown in FIG. 13. Values of four path memories are updated according to a control signal output from the metric selecting unit 204.

FIG. 13 illustrates control of the path memory unit. Reference numeral 301 in FIG. 13 denotes the above-mentioned trellis diagram for the maximum-likelihood decode. Reference numerals 302-305 denote path memories associated with states S00, S01, S10, and S11 at the time k. Each of reference numerals 307-310 denotes a value of each path memory at the time of k+1.

Next, control of a path memory will be described in conjunction with a path leading to the state S00 at the time of k+1. In the state S00 branches "a" and "b" join. At this moment, path metric corresponding to branch "a" is compared with path metric corresponding to branch "b" at the metric comparing unit 203 as shown in the expression (2,1).

When the path metric shown at the branch "a" is selected, a path along branch "a" remains and a path along the branch "b" is deleted. On the basis of a control signal output corresponding to this, a value in the path memory 307 at the time of k+1 is copied by the path memory 304 and "0" is added to its end. When decoded data of each path memory exceeds the number of n, the data is bit shifted to left serially.

At a decoded data selecting unit 202, one of decoded data is selected from four path memories. The path metric corresponding to each of four states is generated at the time of k in the maximum-likelihood decode. At the decoded data selecting unit 202, a state providing the minimum path metric is selected among them and a decoded bit of a first address in a path memory corresponding to this selected state is output.

In this manner, decoded data of PRML is generated. Evaluation index generating unit 104 generates an evaluation index on the basis of the absolute value of a metric difference generated in a decoding process of PRML as described above.

Figure 14:
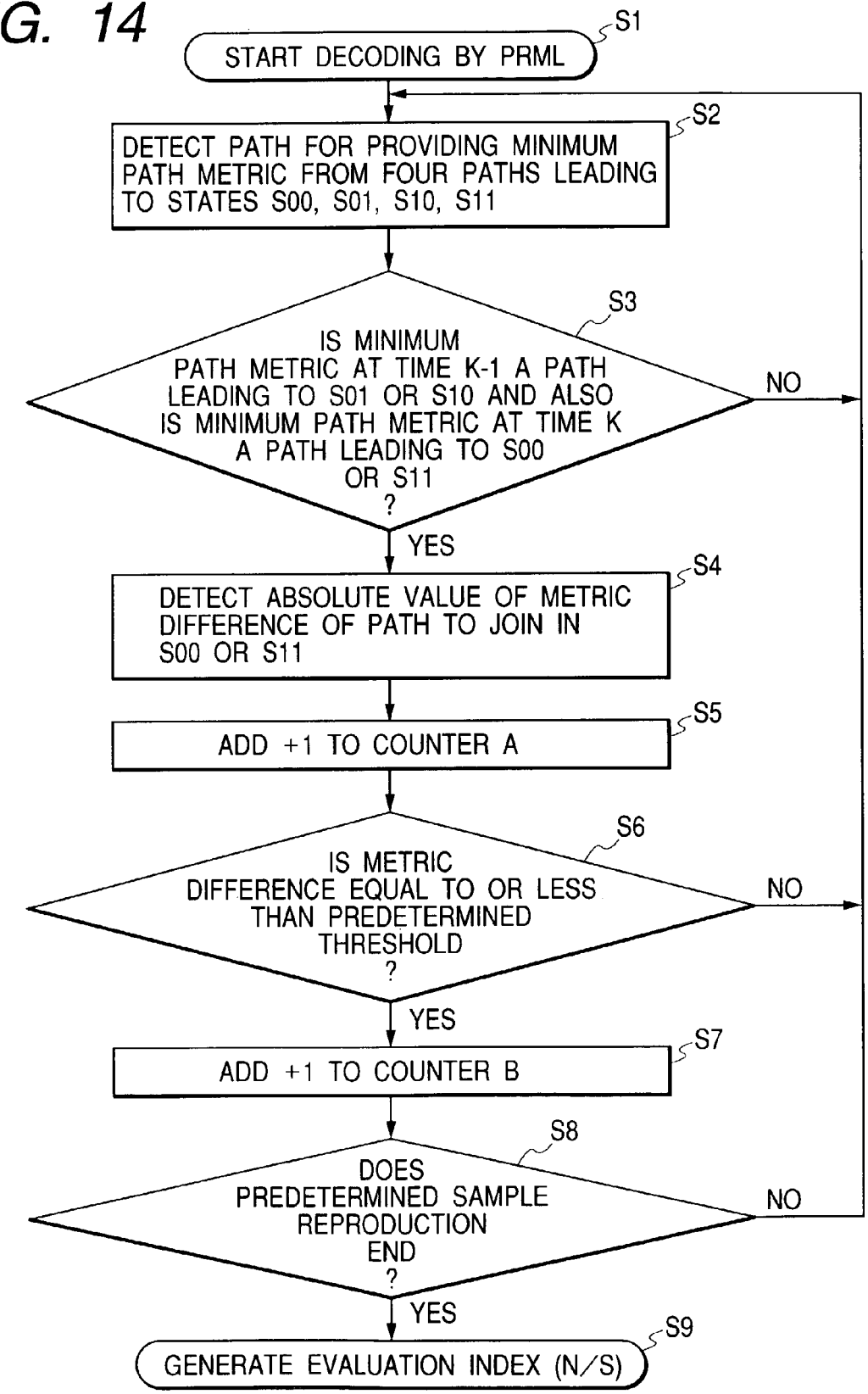
FIG. 14 is a flow chart illustrating an operation of evaluation index generating unit.

Now, an operation of the evaluation index generating unit 104 will be described in conjunction with a flow chart shown in FIG. 14. In FIG. 14, after the start of decoding by PRML (step S1), a path for providing the minimum path metric is detected from four path metrics leading to the states S00, S01, S10 and S11, at each time (step S2).

Next, a state providing the minimum path metric at the current time of k and the minimum path metric at the time of k−1 are detected (step S3). In the maximum-likelihood decode, transitions of states S01→S11 and states S10→S00 correspond to edge parts of a reproduced signal, whereby a metric difference is calculated in the case that the detected result is as follows (step S4).

| Minimum path at time of k − 1 | Minimum path at time of k |
|---|---|
| S01 | S11 → calculate a metric difference |
| S10 | S00 → calculate a metric difference |

Other than the above cases→do not detect

A metric difference is an absolute value of a difference of path metric between two paths joining into state S00 or S11. In this manner, a metric difference at an edge part of a reproduced signal is calculated.

For each time of calculating path metric, +1 is added to a value of counter A (step S5). Next, an absolute value of a calculated metric difference is compared to a predetermined threshold. When the absolute value is equal to or less than the predetermined threshold, +1 is added to a value of counter B (steps S6, S7).

An evaluation index is generated when reproduction of a predetermined sample ends for regulating a parameter (steps S8, S9). The basic flow of metric difference detection has been thus described.

Figure 15:
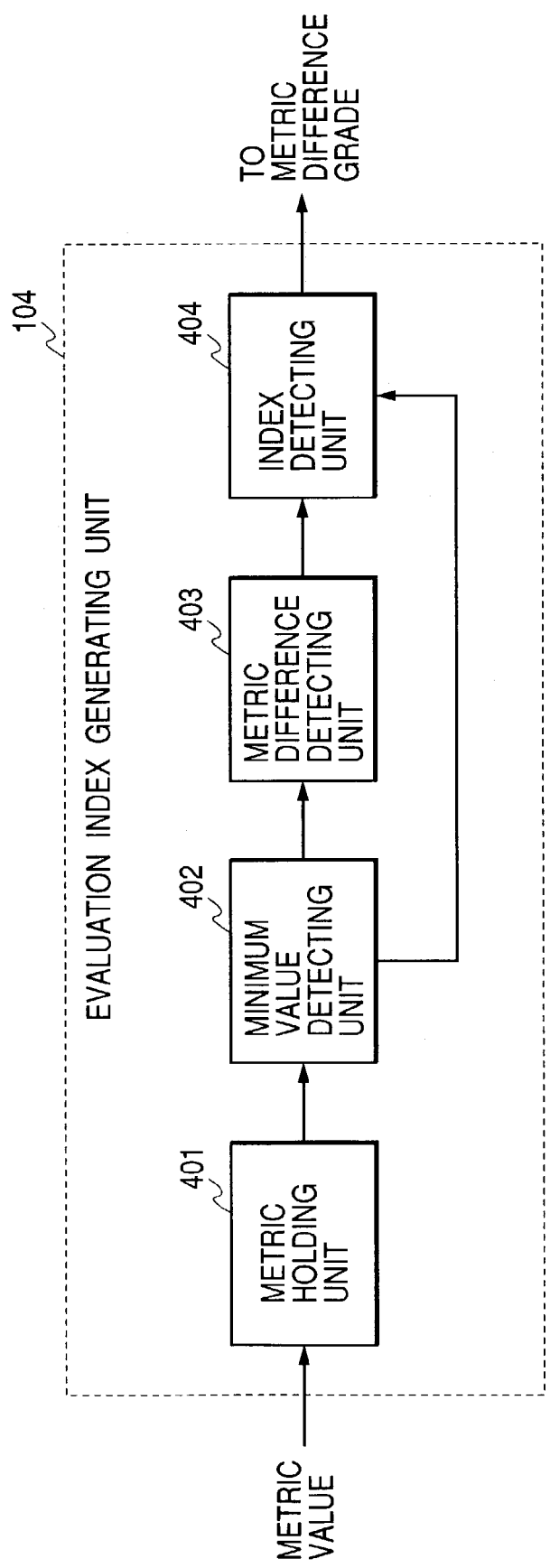
FIG. 15 is a block diagram showing a configuration of an evaluation index generating unit.

FIG. 15 is a block diagram showing the schematic configuration of an evaluation index generating unit 104. A metric value corresponding to each state is provided from the maximum-likelihood decoder 103 to the evaluation index generation unit 104. Reference numeral 401 denotes a metric holding unit, which holds a metric value for each state at the current time and the previous time. Reference numeral 402 is the minimum value-detecting unit, which selects a state for providing the minimum metric from Metric values at the current time. Reference numeral 403 is a metric difference-detecting unit, which generates a metric difference when a state providing the minimum metric matches the above-mentioned condition. A procedure for generating a metric difference is described above.

Figure 16:
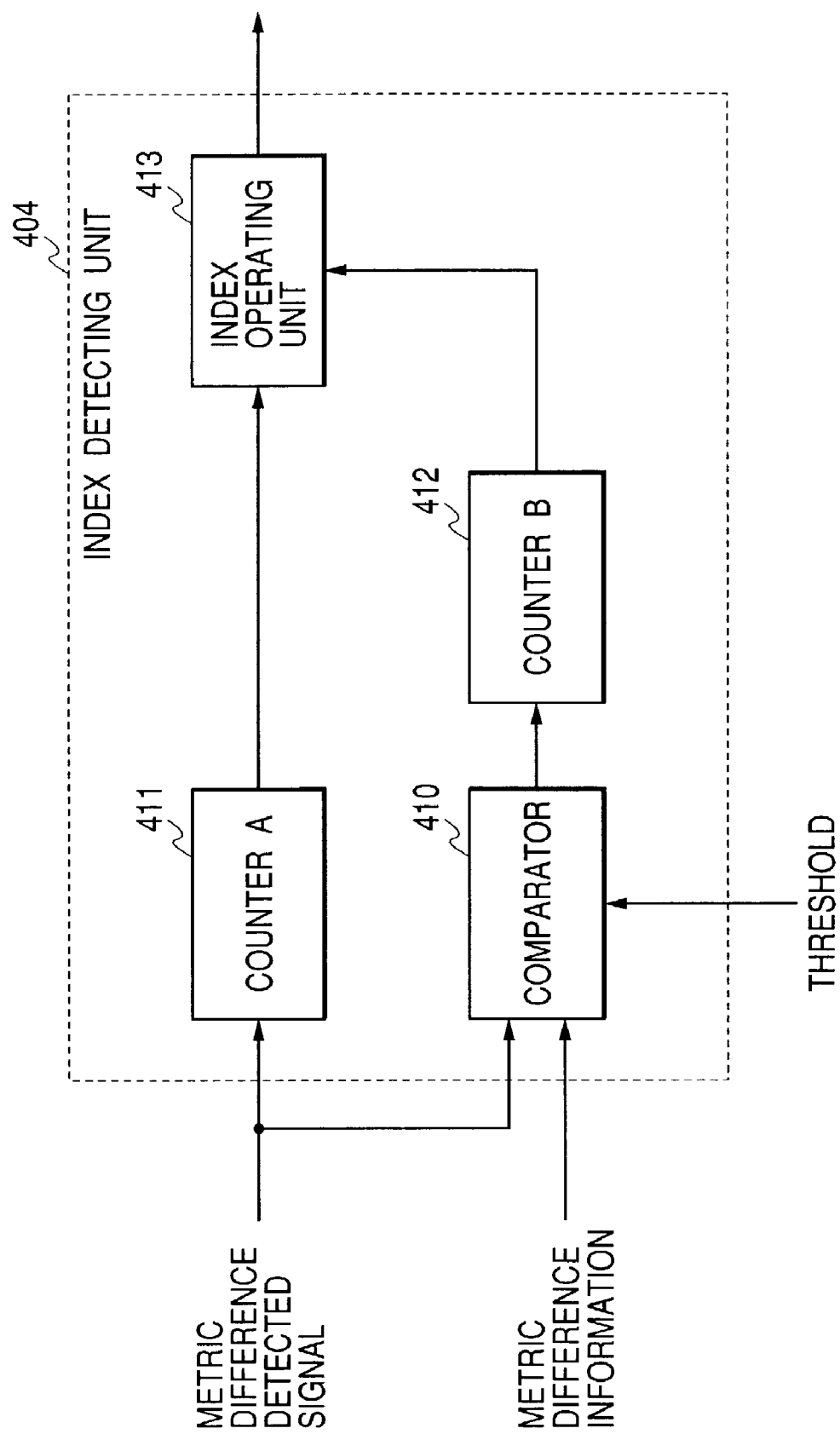
FIG. 16 is a block diagram showing a configuration of an index detecting unit.

The generated metric difference is provided to an index detecting unit 404. FIG. 16 shows a configuration of the index detecting unit 404. When state S00 or S11 is determined to be the minimum value at the minimum value-detecting unit 402, a metric difference-detecting signal is output as a trigger signal the to index detecting unit 404. When a metric difference-detecting signal is input into index detecting unit 404, a value of counter A 411 is incremented. Metric difference information is compared with a predetermined threshold in a comparator 410. When the information is determined to be equal to or less than the predetermined threshold, a value of counter B 412 is incremented. According to the above-mentioned process, an absolute value of a metric difference is compared with a predetermined threshold in the index detecting unit 404, and the number N (value of counter B) of metric differences less than the threshold is measured. At the same time, the total number S (value of counter B) of metric differences to be detected is measured.

When reproduction of a predetermined sample for regulating a parameter ends, an evaluation index is generated. Here, the number N of metric differences less than a threshold is divided by the total number S of metric differences and the obtained value is output as an evaluation index from an index operating unit 413. The value of N/S is called "metric difference grade".

Now, a procedure of the present embodiment using a metric difference grade will be described. First, for example, a gain regulator 24 sets −6 dB in a gain 23. At this moment, a metric difference grade measured at the evaluation index generating unit 104 is stored. Next, for example, −4 dB is set in the gain 23 and a metric difference grade at this moment is stored. By changing a gain to be set in the gain 23 like −6, −4, . . . +2, +4 in this manner, a metric difference grade for each case is stored in association with a set gain.

Figure 17:
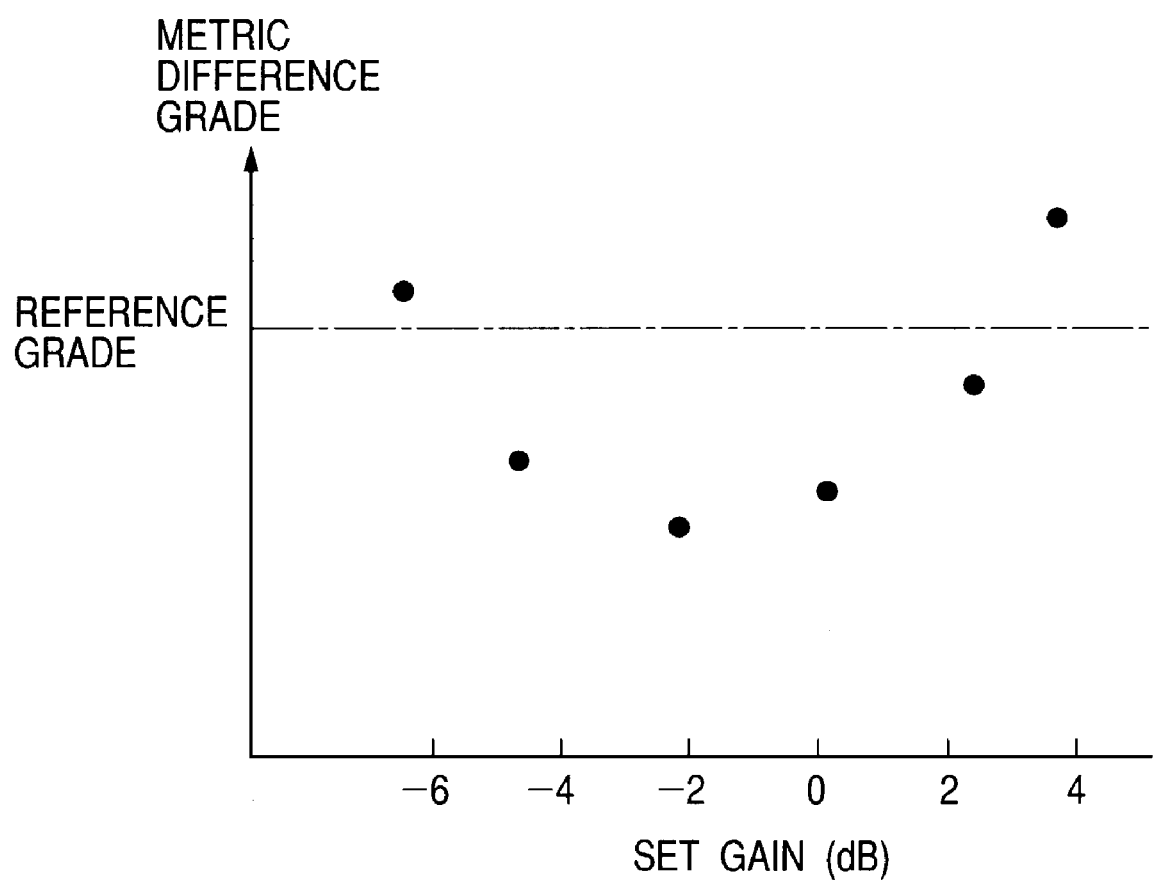
FIG. 17 is a graph showing an exemplary measurement for a set gain and a metric difference grade of the embodiment shown in FIG. 6.

FIG. 17 shows an example of measurement results. As a gain set in the gain 23 changes, a metric difference grade measured at the evaluation index generating unit 104 also changes as shown in FIG. 17, which results in the characteristic of a metric difference grade increasing at both the biggest end and the smallest end of the set gain. A gain regulator 24 finds a gain above a reference metric difference grade line shown in FIG. 17 in the measured data and determines a set gain. Gains above a reference jitter found by using a primary interpolation for the case of FIG. 17 are −5.8 dB and +3 dB. A set gain is determined to be −1.4 dB as the medium value of them, and the gain regulator 24 sets −1.4 dB in the gain 23. In this manner, PLL characteristics with the best metric difference grade can be set. Though in the present embodiment a logarithmic value of a gain is used for axis of abscissas in FIG. 17, a set gain can be determined by handling gain values lineally.

In the present embodiment, in which loop characteristics of PLL is evaluated by using a metric difference grade in PRML, loop characteristics can be evaluated in shorter time and in higher accuracy than in the third embodiment. If an error rate is used in evaluation as described in the second embodiment, the evaluation is performed only for a part with erroneous data, thus, pieces of data of at least 1e3 are needed as it is designated by an error rate around 1e−3, and the number of data bites around 1e4 are required for statistically maintaining accuracy.

On the other hand, the present embodiment can treat probability of error in an analog fashion instead of an error rate; a loop can be evaluated in shorter time than in the second embodiment. Moreover, a metric difference grade focuses on a metric difference of PRML directly relating to an error rate, thus, a state of PLL can be determined in higher accuracy than in the third embodiment.

As mentioned above, the present invention has the following effects.

(1) A gain of PLL can be regulated appropriately by detecting a state of a PLL circuit and regulating a loop gain of the PLL circuit according to a result of the detection result without being influenced by variations in reproduced signals or apparatuses, whereby a highly reliable reproduction of a signal can be implemented.

(2) A gain of PLL can be set in consideration of total performance such as noise characteristics of an actual recording medium by detecting a state of a PLL circuit by using an error rate as an index, whereby an apparatus with larger margin can be implemented.

(3) The best gain of PLL through a state of signal to be reproduced and a state of noise can be set in short time by detecting a state of a PLL circuit by using a likelihood difference as an index.

(4) Adverse effects of amplitude of a reproduced signal, inclination of edge, variations in VCO, etc. can be eliminated by sensing a frequency signal went through a loop of a PLL circuit once, and detecting a state of the PLL circuit according to the sensed frequency signal, whereby an appropriate tractability can be maintained and a stable PLL can be constituted.

(5) The best gain of PLL through a state of signal to be reproduced and a state of noise can be set in short time by detecting a state of a PLL circuit by using a phase difference as an index.

What is claimed is:

1. An information-reproducing apparatus for generating a reproducing clock signal on a basis of a reproduced signal from an information recording medium, comprising:
   a PLL circuit, comprising:
      a phase difference detector for detecting a phase difference between said reproduced signal and said reproducing clock signal, and
      a voltage controlled oscillator for regulating a frequency of said reproducing clock signal to compensate for the detected phase difference;
   an ECC for detecting an error rate of said reproduced signal;
   a circuit for selecting one of several loop gains of said PLL circuit corresponding to several error rates detected by the ECC when several loop gains are set for the PLL circuit; and
   a circuit for operating the PLL circuit with the selected loop gain,
   wherein the loop gain of said PLL circuit is a gain of a signal based on an output of the phase difference detector in said PLL circuit.

2. An information-reproducing apparatus for generating a reproducing clock signal on a basis of a reproduced signal from an information recording medium, comprising:
   a PLL circuit, comprising:
      a phase difference detector for detecting a phase difference between said reproduced signal and said reproducing clock signal, and
      a voltage controlled oscillator for regulating a frequency of said reproducing clock signal to compensate for the detected phase difference;
   a circuit for decoding said reproduced signal by using a maximum-likelihood decode process;
   a circuit for detecting a merge path among a plurality of paths in the maximum-likelihood decode process;
   a circuit for detecting a likelihood difference of said merge path; and
   a circuit for selecting one of several loop gains of said PLL circuit corresponding to the several likelihood differences detected when several loop gains are set for the PLL circuit; and
   a circuit for operating the PLL circuit with the selected loop gain,
   wherein the loop gain of said PLL circuit is a gain of a signal based on an output of the phase difference detector in said PLL circuit.

3. An information-reproducing apparatus for generating a reproducing clock signal on a basis of a reproduced signal from an information recording medium, comprising:
   a PLL circuit, comprising:
      a phase difference detector for detecting a phase difference between said reproduced signal and said reproducing clock signal, and a voltage controlled oscillator for regulating a frequency of said reproducing clock signal to compensate for the detected phase difference;

a circuit for selecting one of several loop gains of said PLL circuit corresponding to several jitters of the phase difference detected when several loop gains are set for the PLL circuit; and a circuit for operating the PLL circuit with the selected loop gain, wherein the loop gain of said PLL circuit is a gain of a signal based on an output of the phase difference detector in said PLL circuit.

* * * * *